United States Patent [19]

King

[11] Patent Number: 5,019,719

[45] Date of Patent: May 28, 1991

[54] TRANSFORMER COUPLED GATE DRIVE CIRCUIT FOR POWER MOSFETS

[75] Inventor: Ray King, Carolina Beach, N.C.

[73] Assignee: International Rectifier Corporation, El Segundo, Calif.

[21] Appl. No.: 464,221

[22] Filed: Jan. 12, 1990

[51] Int. Cl.[5] .................... H03K 17/687; H03K 17/04
[52] U.S. Cl. .................................. 307/246; 307/270; 307/571; 307/577
[58] Field of Search ............... 307/246, 270, 262, 571, 307/579, 585, 296.5, 412, 570, 577, 633

[56] References Cited

U.S. PATENT DOCUMENTS

| | | | |
|---|---|---|---|
| 3,657,568 | 4/1972 | Dargent | 307/268 |
| 3,889,135 | 6/1975 | Nomiya et al. | 307/246 |
| 3,999,086 | 12/1976 | Ekelund | 307/270 |
| 4,360,744 | 11/1982 | Taylor | 307/270 |
| 4,423,341 | 12/1983 | Shelly | 307/570 |
| 4,461,966 | 7/1984 | Hebenstreit | 307/270 |
| 4,937,470 | 6/1990 | Zeiler | 307/270 |

Primary Examiner—Stanley D. Miller
Assistant Examiner—Toan Tran
Attorney, Agent, or Firm—Ostrolenk, Faber, Gerb & Soffen

[57] ABSTRACT

A driving circuit, for switching devices such as power MOSFETs, Insulated Gate Bipolar Transistors and the like, includes a transformer with a primary winding which receives input control signals having positive and negative portions. The driving circuit responds to the control pulses from the secondary winding of the transformer to charge a storage capacitor during the positive portions of the control signals. A pair of low power switching devices, i.e., MOSFETS, are turned on mutually exclusively by the control signals. A first one of the low power MOSFETs is turned on during the positive portion of the control signals to clamp the gate voltage of and keep the power MOSFET turned off and at the same time to enable electrical charge to flow from the control pulse to the storage capacitor. During the subsequent negative portion, the first transistor is turned off and the second transistor is turned on to allow electrical charge to flow from the storage capacitor to the gate of the power MOSFET.

20 Claims, 2 Drawing Sheets

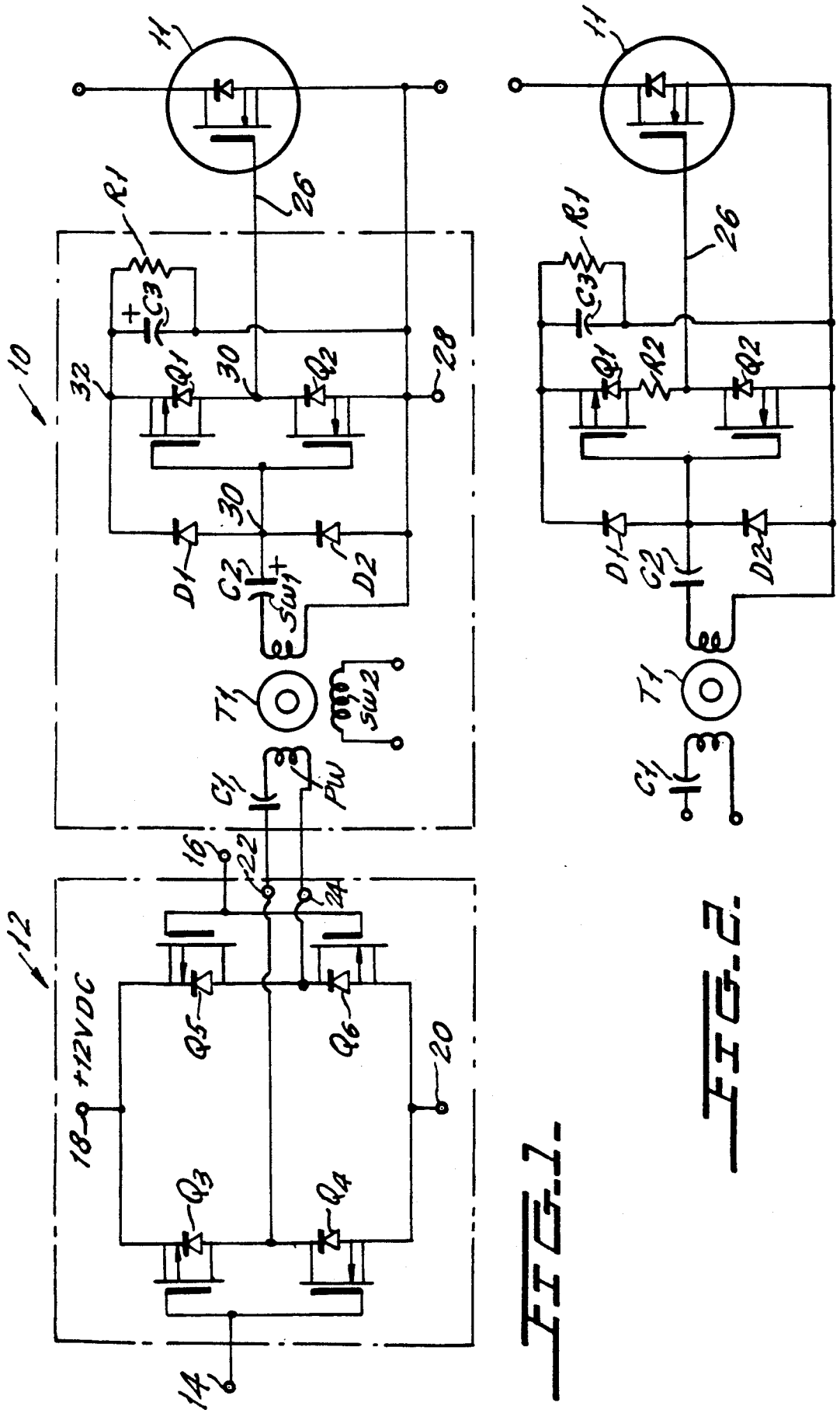

TRANSFORMER COUPLED GATE DRIVE CIRCUIT FOR POWER MOSFETS

BACKGROUND OF THE INVENTION

The present invention relates to a transformer coupled gate drive circuit for power MOSFETs and, more particularly, to a gate drive circuit which sharpens the rise-time of the pulse output of a transformer.

Drive circuits for high power devices such as power MOSFETs and the like, which drive circuits are transformer coupled to user-generated control signals, offer many advantages. These include, for example, impedance matching, DC isolation, improved protection from high voltages, and either step-up or step-down capability. Transformer coupled drive circuits allow circuit designers to reference gate driving control signals to any desired potential instead of to the typically high potentials which are present at the driven power MOSFETs or in the gate drive circuits thereof. This facilitates interfacing to and driving of power MOSFET devices and further permits the use of easily generated signals such as those that might be obtained from an output port of a microprocessor and similar low voltage devices. Transformer coupling provides many other advantages, as is well recognized in the art.

Nevertheless, certain attributes of transformers interfere with the ability to fully capitalize on their advantages. For example, transformers can deliver only AC signals since the core flux must reset, i.e. reverse itself, each half cycle. This is referred to as the "constant volt seconds" requirement of transformers. In essence, according to this requirement, the product (absolute value) of the voltage multiplied by time, in each half cycle, must be equal. As the duty cycle of an input is varied, the constant volt seconds requirement results in large voltage swings on the transformer as the duration of reset pulses is adjusted to control the power MOSFET.

Also, the signal rise-time of transformer signals is comparatively slow, which can result in excessively delayed and power wasteful switching of power MOSFETs in certain applications. There are also limitations which arise from the special considerations which must be given to the core, insulation, etc. of transformers.

It is accordingly desirable to be able to provide a transformer coupled drive circuit for high power transistors, including power MOSFETs, which avoids the disadvantages of transformers, particularly the slow rise-time of transformer outputs.

The prior art is familiar with various driving circuits for high power switching devices, including several which provide transformer isolation. This prior art is exemplified by several United States patents and by an Application Note of the assignee of the present invention, the International Rectifier Corporation.

The Application Note (No. 950A, reproduced at pages i-75 to i-77 of the fourth edition of International Rectifier's *HEXFET DESIGNER'S MANUAL, POWER MOSFET APPLICATIONS AND PRODUCT DATA*) illustrates and describes a single gate driving transistor which is disposed between the secondary of a coupling transformer and the gate of a HEXFET® power switch. The circuit has a high duty cycle ratio of 1-99% and any desired voltage ratio. The coupling transformer provides, of course, electrical isolation and other benefits of transformer coupling.

U.S. Pat. No. 3,609,405 discloses a sharp rise-time and fall-time, high amplitude pulse generator. FIG. 1 of the patent illustrates a pair of series connected bipolar transistors 42 and 44 which operate in a push-pull fashion. A capacitor 60 charges and discharges and thereby drives the base of a transistor 62. Since the discharge path for capacitor 60 has a very low impedance, the base drive to transistor 62 is high causing it to turn on rapidly. This rapid turn-on of transistor 62 results in a step-output having a rise-time on the order of 10 nanoseconds.

U.S. Pat. No. 3,657,568 discloses a pulse shaping circuit using complementary MOS devices having their gates connected in common to a MOS transistor switch for switching power to a load coil. A drive circuit for the MOS devices comprises, as an input stage, a differentiator consisting of a simple R-C circuit for the differentiating input pulses derived from the frequency converter of a typical electronic-type watch. The differentiated input pulses are applied to the MOSFETs, which produce sharp, square pulses, which are in turn applied to a switching transistor, also, preferably, in the form of a MOSFET.

U.S. Pat. No. 4,002,927 discloses a pulse control circuit comprising a first FET, which enters a conductive state in response to an input pulse, a first time constant circuit charged with the first FET and thereby put in a conductive state, a second FET which is rendered conductive with a charging voltage of the first time constant circuit, and a second time constant circuit for discharging the charged electricity in the first time constant circuit when the second FET is put in the conductive state.

Additional representative art is described in U.S. Pat. Nos. 3,573,502 and 3,446,993.

However, the need remains for a more effective drive circuit which is particularly suited for converting slow rise time, transformer coupled gate drive signals into signals having very sharp rise-times for driving power MOSFETs.

SUMMARY OF THE INVENTION

It is an object of the present invention to provide a gate driving circuit for power MOSFETs, of a type which includes transformer coupling and which is capable of producing a sharply rising gate drive signal.

It is a further object of the invention to provide a gate driving circuit for power MOSFETs which has a simple and easy to manufacture construction.

The foregoing and other objects of the invention are realized with a gate drive circuit which is highly effective for sharpening the, transformer coupled, pulse input to power MOSFETs. As noted, it is necessary that when a pulse is produced on te primary of a transformer, the power MOSFET should turn on as quickly as possible. However, the inherent characteristics of the transformer and the effect of the leakage inductance of the power MOSFET cause a comparatively slow-rising transformer output. In contrast, in circuit of the invention, the rise-time of the control pulse to the MOSFET is extremely short (from 4-7 times faster than the rise-time of the transformer) thus permitting far more efficient operation of the power MOSFET.

Essentially, the rise-time of the output pulse of the pulse transformer is improved because switching of the power FET is delayed past the transition, i.e. pulse rise, of the transformer output pulse. While the transformer pulse is rising and during the flat-top portion thereof, the pulse is used for charging a comparatively small valued storage capacitor. Subsequently, the energy stored in the capacitor is rapidly released to drive the gate of the power MOSFET. Thus, the rise of the pulse transformer sees a smaller capacitance during the rise-time of the pulse as compared to the capacitance it would have had to drive had it been coupled directly, or even through a transistor, to the large power MOSFET.

In accordance with a preferred embodiment, the gate drive circuit for achieving the foregoing is comprised of a pair of diodes, a pair of series connected first and second low power FETs, the aforementioned storage capacitor and a shunt resistor connected in parallel with the storage capacitor.

The low power FETs are coupled to the gate of the power MOSFET, with the second low power MOSFET being further coupled to the storage capacitor in a manner whereby it is capable of applying the electrical energy stored in the capacitor to the gate of the power MOSFET. The transformer pulse controls the low power FETs such that the first FET is turned on during the rise and positive portion of the pulse of the transformer which operates to keep, i.e., clamp, the voltage at the gate of the power MOSFET at a level which renders and maintains the power MOSFET turned off. During this positive pulse the second FET is held off, and the positive pulse energy flows into, via one of the aforementioned diodes, and charges the storage capacitor to the voltage of the pulse.

During the negative transition of the transformer pulse, the first FET is turned off and the second FET is turned on. This removes the voltage clamp from the gate of the power MOSFET and causes electrical charge to flow from the storage capacitor to the gate of the power MOSFET turning the power MOSFET on. The power MOSFET turns on very rapidly as a result of being driven from the capacitor through the second lower power MOSFET, rather than by the transformer as in the prior art.

In the present invention, the inductance in the series path for the gate charge and discharge of the power MOSFET is not reflected back to the primary of the pulse transformer.

Further, the gate charge and discharge paths are very short, making possible rise-times on the order of 4-7 times faster than with a pulse transformer alone, on the order of about 50 nanoseconds, or 50/4-50/7 nanoseconds.

Also included is a pair of (preferably) equally sized capacitors. These capacitors are respectively connected in series with the primary and secondary windings of the transformer to equalize the flux in the core of the transformer to enable operation with large duty cycle variations.

Other features and advantages of the present invention will become apparent from the following description of the invention which refers to the accompanying drawings.

BRIEF DESCRIPTION OF THE DRAWINGS

FIG. 1 is a circuit diagram of a first embodiment of the present invention.

FIG. 2 shows a second embodiment of the power MOSFET driving circuit of the present invention.

FIG. 4 schematically depicts the short signal path traversed by signals which develop when the power MOSFET is turned on.

DETAILED DESCRIPTION OF THE DRAWINGS

Figure 3:
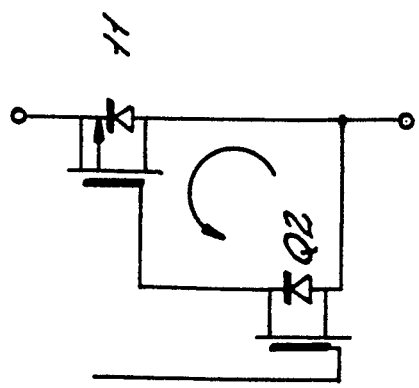
FIG. 3 shows a modified, half-wave bridge circuit for coupling a control signal to the transformer of the present invention.

Referring to FIG. 1, a gate drive circuit 10 for driving a power MOSFET is transformer coupled to a CMOS switching circuit 12. Depending on the polarity of control signals which are applied to control inputs 14 and 16 of the CMOS switching circuit 12, a current flows in one or the other direction through the output terminals 22 and 24 of the CMOS switching circuit 12, the capacitor C1 and the primary winding PW of the transformer T1. This current is derived from the voltages which are applied to the power terminals 18 and 20 of the switching circuit 12.

By itself, the CMOS switching circuit 12 is conventional. In accordance with FIG. 1, it comprises FET transistors Q3-Q6, transistors Q3 and Q5 comprising P-channel devices, e.g., International Rectifier Part Nos. IRFU010, and transistors Q4 and Q6 comprising N-channel devices, e.g., International Rectifier Part Nos. IRFU9010. The switching circuit 12 develops at its output terminals 22 and 24 a pulse control voltage whose duty cycle varies in accordance with the waveforms of the control signals which are applied to the input terminals 14 and 16.

The main purpose of the gate drive circuit 10 of FIG. 1 is to minimize as much as possible the switchover duration of the power MOSFET 11 from conductive to nonconductive and vice-versa states in response to each transition in states of the control signal.

In accordance with the present invention, the pulse output at the terminals 22 and 24 of the switching circuit 12 is coupled to the gate terminal 26 of the power MOSFET 11 via the gate driving circuit 10. This gate driving circuit 10 includes the aforementioned capacitor C1 which is connected in series with the primary winding PW of the transformer T1, forming a series circuit which is connected to the output terminals 22 and 24 of the CMOS switching circuit 12.

The transformer T1 includes one or more secondary windings, FIG. 1 illustrating an embodiment having a first secondary winding SW1 and a second, secondary winding SW2. Accordingly, positive and negative pulses applied through the output terminals 22 and 24 induce corresponding pulses at the secondary winding SW1 and SW2.

On one side thereof, the secondary winding SW1 is connected to common node 28 while the second side thereof is connected to a capacitor C2 which is further connected to a circuit node 30. In conjunction with the diode D2 which is connected between the nodes 28 and 30, a DC restorer circuit is formed by the winding SW1, the capacitor C2 and the diode D2 which assures that the voltage at the node 30 remains positive regardless of negative fluctuations of the voltage at the output terminals 22 and 24 of the CMOS switching circuit 12. However, in response to positive voltage swings at the primary winding PW, the circuit 10 will produce positive voltage pulses at the node 30.

Diode D1 is connected with its anode at the node 30 and cathode at a further circuit node 32 and serves to conduct positive voltage pulses to the capacitor C3 to store electrical charge therein. Both the capacitor C3 and a resistor R1 which is connected in parallel with it are disposed between the nodes 28 and 32. The resistor R1 serves to discharge the capacitor C3 when the circuit is turned off or in the prolonged absence of positive pulses at the node 30.

Further connected between the nodes 28 and 32 and parallel with the capacitor C3 and resistor R1 is a pair of series-connected low power MOSFET transistors Q1 and Q2. The FET Q1 is a P-channel device, preferably an International Rectifier IRFU014, and the FET Q2 is an N-channel device, preferably an International Rectifier IRFU9014.

As also shown in FIG. 1, the gates of the FETs Q1 and Q2 are connected to one another and are commonly controlled by the voltage at the node 30. An output for driving the gate 26 of the power MOSFET 11 is taken from the commonly connected drain terminals of the FETs Q1 and Q2.

The gate driving circuit 10 operates as follows. When power is first applied to the power MOSFET 11, the control logic is not yet activated. The capacitor C3 will then be in a fully discharged state due to the presence of the resistor R1 and will comprise a low impedance for the "Miller Effect" which is induced by the power MOSFET 11. This low impedance is attributable to the body drain diode inside the FET Q1.

Let it be assumed that the first pulse that is applied to the transformer primary winding PW is positive. This positive pulse will then appear at the secondary winding SW1 and will serve to charge the capacitor C3, through the capacitor C2 and the diode D1. This same positive pulse will also provide a gate drive to the low power FET Q2 which will cause FET Q2 to turn on, clamping the voltage at the gate 26 of the power MOSFET 11 to the potential of the common node 28, thus ensuring that the power MOSFET 11 is kept turned off.

The next polarity at the primary winding PW will be negative. This will produce a voltage at the node 30 which will cause the FET Q1 to turn on and the FET Q2 to turn off. Consequently, electrical charge previously stored in the capacitor C3 will flow through the FET Q1 to the gate 26 of the power MOSFET 11 turning it on very rapidly as a result of the low impedance of the gate drive circuit 10.

An equally fast response is obtained subsequently when the polarity of the pulse becomes positive again. The second positive pulse will cause FET Q1 to turn off, blocking off the voltage from capacitor C3 and turning the FET Q2 on which will rapidly turn off the power MOSFET 11.

During transitions from positive to negative and from negative to positive pulses there will be a period when both the P-channel FET Q1 and the N-channel FET Q2 will be conducting current simultaneously. A low impedance is presented by the FET Q1 and the capacitor C3. This results in very sharp rise time pulses driving the gate 26 of the power MOSFET 11 which is very desirable for a power MOSFET.

Also, prior to switching, excess energy will flow through both FETs Q1 and Q2, regulating the voltage at the node 32 (i.e., the positive node of capacitor C3). This eliminates the need for a zener diode and constantly loads the capacitor C2 for changing duty cycles of the pulse inputted at the primary winding PW. The output voltage of the capacitor C3 is, therefore, controlled by the threshold voltages and the transconductance of the series-connected FETs Q1 and Q2.

Note that if the first pulse during a power turn on were to be negative, the capacitor C2 would be charged by the diode D2 to the peak of the drive pulse and will be thus properly initialized for later pulses.

The capacitor C1 at the primary side of the transformer T1 is to keep an energy charge for the primary of the pulse transformer in order to obtain a constant volt second operation for both positive and negative pulses as is mandatory for transformers It is desirable that the values of the capacitances of C1 and C2 be about equal to one another and an order of magnitude larger than the capacitance of capacitor C3.

As noted, the diode D2, in conjunction with capacitor C2, forms a DC restorer circuit which prevents the voltage at the node 30 from going negative and keeps C3 from discharging. The circuit 10 is further able to hold the FET Q2 turned on for longer periods of time, thus, keeping the power MOSFET 11 turned off for periods longer than the volt/seconds limit of the pulse transformer T1 would otherwise permit.

Moreover, the drive circuit 10 can be used to produce on "times" that are only limited by the volt/seconds of the pulse transformer or, as little as 50 to 100 nanoseconds.

Figure 6:
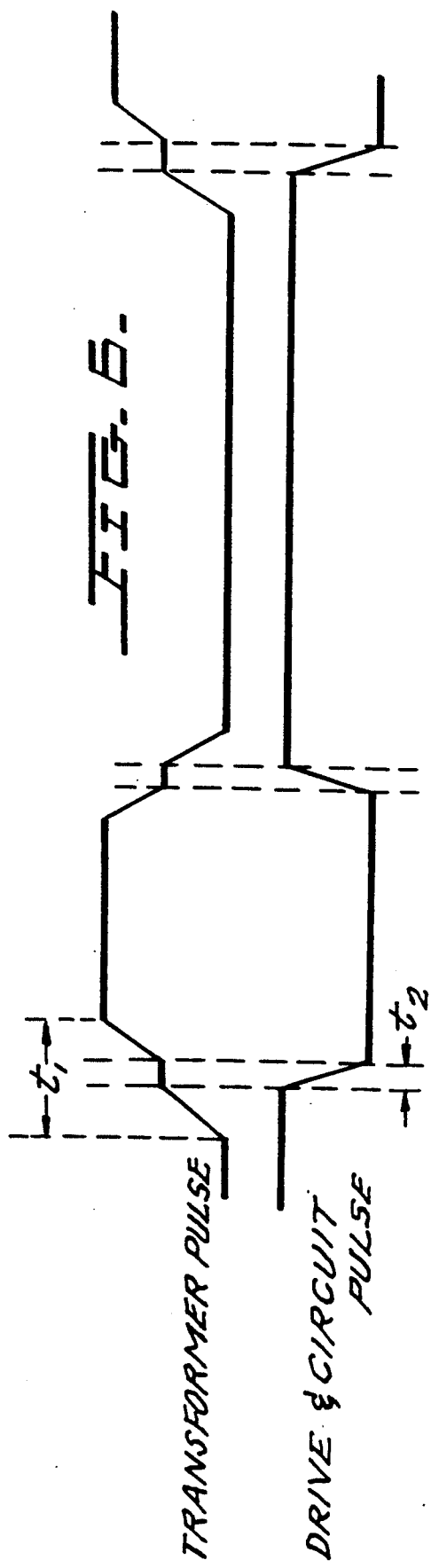
FIG. 6 is a timing diagram which illustrates the relative pulse rise and fall times of the outputs of the pulse transformer and the gate drive circuit.

Thus, as shown in FIG. 6, the relatively sluggish rise-time $t_1$ of the output pulse of the pulse transformer is improved to a much faster rise time $t_2$ on account of the transconductance of the two FETs Q1 and Q2, resulting in switching of the power MOSFET 11 in only several tens of nanoseconds.

Referring further to FIG. 6, note that the rising edge of the output pulse of the pulse transformer T1 signals the switching action when the power MOSFET 11 is turned off and charging of the capacitor C3 begins. The charge that is needed for rapidly turning on the power device is stored in the capacitor C3 primarily during the flat top portion of the output of the pulse transformer. Thus, the rising edge of the output of the transformer sees a smaller capacitance during its rise-time than it would have were it to drive the large power MOSFET 11 directly.

Also, the inductance in the series path for the gate charge and discharge of the power MOSFET is not reflected back to the primary of the pulse transformer.

Figure 4:
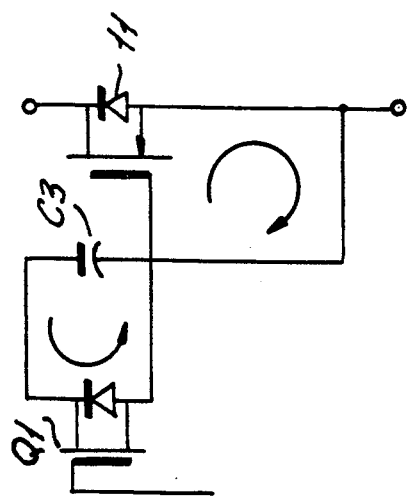
Figure 5:
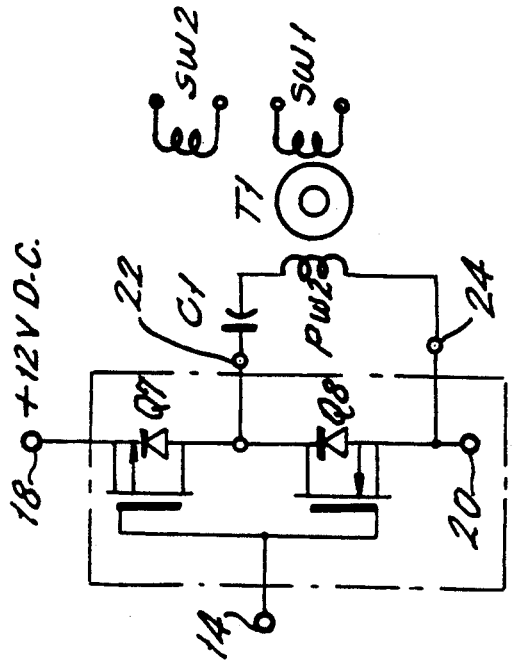
FIG. 5 schematically depicts the short signal path traversed by signals which are present when the power MOSFET is held off.

Further, the gate charge path is very short, as depicted in FIG. 4, as is the gate discharge path, as depicted in FIG. 5. All this makes possible rise-times 4–7 times faster than the transformer alone would have been able to produce.

The advantages of the gate driving circuit 10 include an ability to drive the power MOSFET 11 with control signals having duty cycles from 5% to 95% primarily on account of the capacitors C1 and C2. The deleterious effect on rise-time normally experienced with transformer coupling, as a result of leakage inductance and the like, are avoided. The power MOSFET 11 sees a low impedance during start-up. No floating power supply is required for powering the gate drive circuit 10 for the power MOSFET 11. Switching rates of better than 50 nanoseconds are obtained. The power MOSFET is held off with a low impedance during the entire off period.

Moreover, the power MOSFET 11 will be held off on either a loss of gate drive or loss of control power. Further advantages which ensue from the drive circuit 10 of the present invention include operation beyond the volt/seconds limit of the pulse transformer, and an ability to use a transformer with only 2-3 turns, and certainly less than 10 turns, on the primary and secondary windings, in many applications. Some applications may require a greater number of turns. The latter feature, in particular, permits the invention to use a smaller transformer with more dielectric insulation on its windings and, therefore, achieve operation at far higher voltage levels, e.g. as high as 2,000 volts. By way of comparison, prior art transformers in application of this nature would have required at least 100 turn windings. Indeed, the greater number of turns required by the prior art generates more capacitance which undesirably tends to increase the rise-time of the transformer pulse.

Note, too, that the present invention operates by delaying the feeding of positive signals to the power MOSFET 11 until the arrival of the negative pulse. The control signals and the driving signals for the power MOSFET are therefore 180° out of phase, causing the driving signal to act regeneratively on the input pulse transformer, rather than degeneratively as in the prior art. Further, the core used in the transformer T1 is a half-wave rectifier so that its peak to peak voltage is not 24 but only 12 volts, since it never goes negative.

The following represent typical values and part identifications for several of the components in FIG. 1.

| C1, C2 = 1 uF | T1 (transformer) core |
| --- | --- |
| C3 = .05 to .2 uF | T5325 T MC25 (2-3 turns |
| D1 and D2 = 11DQ030 | and 1:1 turns ratio) |
| R1 = 10 K typical | MFG ceramic magnet. |

The circuit in FIG. 2 is in every respect identical to the gate drive circuit 10 in FIG. 1 with the minor modification that an additional resistor R2 is connected in series between the drains of the FETs Q1 and Q2. This improves turn on speed. R2 should preferably be between 0.1 to 10Ω.

The second, secondary winding SW2 depicted in FIG. 1 is intended to be connected, in applications where it is needed, to a second gate drive circuit identical to the gate drive circuit 10 for the purpose of driving a second power MOSFET. A typical application might be a power supply or the like where it is necessary to drive more than a single power MOSFET. Where required, more than two secondary windings may be provided.

FIG. 3 depicts a variant CMOS switching circuit 36 having transistors Q7 and Q8 for use instead of the CMOS switching circuit 12 of FIG. 1. The switching circuit 36 is simpler as it comprises only half-wave bridge rectifier-type switch for driving unidirectional pulses through the transformer T1.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driving circuit for a power transistor, comprising:
   a transformer having a primary winding responsive to an input control signal and a secondary winding for producing an output pulse having multiple control cycles wherein each control cycle comprises first and second sub-cycles; and
   a gate drive circuit coupled to the secondary winding of the transformer and effective for driving the power transistor;
   the gate circuit including:
   a first capacitor and a coupling device, connected between the first capacitor and the secondary winding, for coupling the first capacitor to the secondary winding;
   a first switching device connected between the first capacitor and a control electrode of the power transistor, in a manner which enables selective conduction of electrical charge from the first capacitor to the control electrode;
   a second switching device having one terminal connected to the control electrode of the power transistor and operable in a manner which enables the second switching device to selectively turn off the power transistor; and
   means for controlling the first and second switching devices;
   the transformer, the first capacitor and the first and second switching devices having such construction and being so connected, and the means for controlling the first and second switching devices being so effective, as to enable electrical charge to flow from the output pulse into the first capacitor essentially during the first sub-cycle and so as to activate the first switching device to conduct the electrical charge from the first capacitor to the control electrode of the power transistor, to turn on the power transistor during the second sub-cycle.

2. The driving circuit of claim 1, wherein the second switching device is effective for keeping the power transistor turned off during the first sub-cycle.

3. The driving circuit of claim 2, in which the coupling device comprises a first diode.

4. The driving circuit of claim 1, wherein the first and second switching devices comprise a pair of series connected low power MOSFETs.

5. The driving circuit of claim 4, in which the first switching device is a first p-channel MOSFET, the second switching device is a second N-channel MOSFET, the first and second MOSFETs being connected to one another at their sources and said sources being connected to a control electrode of the power transistor.

6. The driving circuit of claim 1, in which the power transistor is a power MOSFET.

7. The driving circuit of claim 1, further comprising a first resistor connected in parallel with the first capacitor.

8. The driving circuit of claim 7, in which the first capacitor is connected in parallel with the first and second switching devices.

9. The driving circuit of claim 1, wherein each of the first and second switching devices has a respective control gate, the respective control gates being connected to one another and coupled to the secondary winding of the transformer.

10. The driving circuit of claim 1, further comprising a second capacitor connected in series between one electrode of the secondary winding of the transformer and control gates of the first and second switching devices.

11. The driving circuit of claim 10, further comprising a second diode connected to the secondary winding of the transformer and forming closed series circuit which includes the secondary winding, the second diode, and the second capacitor.

12. The driving circuit of claim 11, further comprising a third capacitor connected in series with the primary winding of the transformer.

13. The driving circuit of claim 12, in which the second and third capacitors have about equal capacitances.

14. The driving circuit of claim 13, in which the value of the second capacitor is at least about an order of magnitude larger than that of the first capacitor.

15. The driving circuit of claim 7, further comprising a second resistor connected in series between the first and second switching devices.

16. The driving circuit of claim 1, further including a second circuit coupled to the gate drive circuit and effective for supplying thereto the input control signal, the second circuit comprising a CMOS switching circuit.

17. The driving circuit of claim 1, further including a second circuit coupled to the gate drive circuit and effective for supplying thereto the input control signal, the second circuit comprising a half-wave rectifier circuit.

18. The driving circuit of claim 1, further comprising at least one addition-al. secondary winding and a respective power transistor driving circuit connected to each said at least one additional secondary winding.

19. The driving circuit of claim 18, wherein each said respective power transistor driving circuit has the construction of said gate drive.

20. The driving circuit of claim 1, wherein the transformer has less than 10 turns on the primary winding.

* * * * *